(12) United States Patent
Park

(10) Patent No.: US 8,611,124 B2
(45) Date of Patent: Dec. 17, 2013

(54) SEMICONDUCTOR MEMORY DEVICE INCLUDING PLURALITY OF MEMORY CHIPS

(75) Inventor: Ki-Tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/537,321

(22) Filed: Jun. 29, 2012

(65) Prior Publication Data

US 2012/0262975 A1    Oct. 18, 2012

Related U.S. Application Data

(63) Continuation of application No. 13/052,439, filed on Mar. 21, 2011, now Pat. No. 8,213,208, and a continuation of application No. 12/360,138, filed on Jan. 27, 2009, now Pat. No. 7,916,511.

(30) Foreign Application Priority Data

Jan. 28, 2008   (KR) .................... 10-2008-0008771

(51) Int. Cl.
*G11C 5/02* (2006.01)
(52) U.S. Cl.
CPC ..................................... *G11C 5/025* (2013.01)
USPC .............. 365/51; 365/226; 365/199; 365/63; 365/194; 365/191

(58) Field of Classification Search
CPC ............. G11C 5/02; G11C 5/143; G11C 7/20
USPC ........ 365/51, 226, 191, 194, 199, 233.1, 236, 365/63
See application file for complete search history.

(56) References Cited

U.S. PATENT DOCUMENTS

| | | | |
|---|---|---|---|
| 6,749,281 | B2 | 6/2004 | Asauchi |
| 6,991,964 | B2 | 1/2006 | Matsu et al. |
| 7,123,497 | B2 | 10/2006 | Matsui et al. |
| 7,916,511 | B2 | 3/2011 | Park |
| 8,076,764 | B2 | 12/2011 | Yamada et al. |
| 2004/0257847 | A1* | 12/2004 | Matsui et al. ................... 365/63 |
| 2005/0082664 | A1 | 4/2005 | Funaba et al. |

FOREIGN PATENT DOCUMENTS

| | | |
|---|---|---|
| JP | 05-225116 | 9/1993 |
| JP | 2007-157266 | 6/2007 |
| KR | 10-0393214 | 7/2003 |

* cited by examiner

*Primary Examiner* — Thong Q Le
(74) *Attorney, Agent, or Firm* — Volentine & Whitt, PLLC

(57) ABSTRACT

A semiconductor memory device includes a plurality of memory chips each including a chip identification (ID) generation circuit. The chip ID generation circuits of the respective memory chips are operatively connected together in a cascade configuration, and the chip ID generation circuits are activated in response to application of a power supply voltage the memory device to sequentially generate respective chip ID numbers of the plurality of device chips.

16 Claims, 11 Drawing Sheets

FIG.5

| Signals-Time | After Power-on | t0 | t1 | t2 | t3 | t4 | Final |
|---|---|---|---|---|---|---|---|
| pup | L | H | L | L | L | L | L |
| st | X | L | H | L | L | L | L |
| det1 | X | L | L | L | L | L | L |
| con1 | X | L | H | L | L | L | L |
| cout1 | XX | 11 | 00 | 00 | 00 | 00 | 00 |
| det2 | X | L | L | H | L | L | L |
| con2 | X | L | H | H | L | L | L |
| cout2 | XX | 11 | 00 | 01 | 01 | 01 | 01 |
| det3 | X | L | L | H | H | L | L |
| con3 | X | L | H | H | H | L | L |
| cout3 | XX | 11 | 00 | 01 | 10 | 10 | 10 |
| det4 | X | L | L | H | H | H | L |
| con4 | X | L | H | H | H | H | L |
| cout4 | XX | 11 | 00 | 01 | 10 | 11 | 11 |

SEMICONDUCTOR MEMORY DEVICE INCLUDING PLURALITY OF MEMORY CHIPS

PRIORITY CLAIM

This application is a continuation application of application Ser. No. 13/052,439, filed Mar. 21, 2011, which is a continuation application of application Ser. No. 12/360,138 filed on Jan. 27, 2009, which claims priority to Korean patent application 10-2008-0008771, filed Jan. 28, 2008, the disclosure of which is incorporated herein in its entirety.

SUMMARY

The present invention generally relates to semiconductor devices, and more particularly, the present invention relates to semiconductor memory devices which include a plurality of memory chips.

Memory device are generally know in which multiple memory chips are assembled together to form a device package, such as by stacking the memory chips. One wafer-level fabrication technique is known as through-silicon-via TSV, in which conductive vias are made to extend through the stack of memory chips.

In the meantime, prior to normal operations, it is necessary for the host processor initialize the system to determine, among other things, the chip identification number (ID) of each of the memory chips stacked within the memory device.

According to an aspect of the present invention, a semiconductor memory device is provided which includes a plurality of memory chips each including a chip identification (ID) generation circuit. The chip ID generation circuits of the respective memory chips are operatively connected together in a cascade configuration, and the chip ID generation circuits are activated in response to application of a power supply voltage to the memory device to sequentially generate respective chip ID numbers of the plurality of device chips. Each chip ID generation circuit receives a pulse signal output from a preceding chip ID generation circuit among the plurality of cascade connected chip ID generation circuits.

According to another aspect of the present invention, a semiconductor memory device is provided which includes a chip stack package including a plurality of stacked semiconductor memory chips, a supply voltage line extending through the chip stack package and electrically connected to the semiconductor memory chips, a plurality of power-on voltage detectors respectively located in the semiconductor memory chips and electrically connected to the supply voltage line, and a plurality of chip identification (ID) generation circuits respectively located in the semiconductor memory chips and electrically connected to the respective power-on voltage detectors. The chip ID generation circuits are operatively connected in a cascade configuration within the chip stack package, and the chip ID generation circuits are activated by the respective power-on detectors in response to application of the supply voltage on the supply voltage line to sequentially generate chip ID numbers of the respective semiconductor memory chips.

According to yet another aspect of the present invention, a semiconductor memory package is provided which includes a plurality of memory chips, each of the memory chips including a respective chip identification (ID) signal generation circuit. The chip ID signal generation circuits are activated in response to the detection of an external supply voltage to automatically generate a sequence of chip ID signals of the respective memory chips. The memory chips are stacked.

BRIEF DESCRIPTION OF THE DRAWINGS

The above and other aspects and features of the present invention will become readily apparent from the detailed description that follows, with reference to the accompanying drawings, in which:

FIG. 5 is a state transition table for use in describing the initialization of the memory device of FIG. 2 according to an embodiment of the present invention;

DETAILED DESCRIPTION OF EMBODIMENTS

The present invention will be described in detail below by way of preferred, but non-limiting, embodiments of the invention. The embodiments presented herein are considered examples of various implementations of the invention, and are not intended to limit or specifically define the overall scope of the invention.

For ease of understanding and to avoid redundancy, like reference numbers refer to the same or similar elements throughout the drawings. Also, while the drawings contain a number of circuit elements, it will be understood from the nature of electrical circuits that when an element is described as being connected to another element, it can be directly connected the other element or one or more intervening elements may be present. In contrast, if an element is referred to as being "directly connected to" another element, then no intervening elements are present. Other words used to describe the relationship between elements should be interpreted in a like fashion (e.g., "between" versus "directly between," "adjacent" versus "directly adjacent," "connected" versus "directly connected," etc.).

As is traditional in the field of the present invention, embodiments of the invention may be described at least partially in terms of functional blocks or units. It will be readily understood that the functional blocks or units denote electronic circuits which are configured (e.g., by dedicated and/or programmable circuitry) to execute the signaling and/or computational operations described herein. Also, it will be readily understood that one or more functional blocks may be physically combined into complex circuitry without departing from the spirit and scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
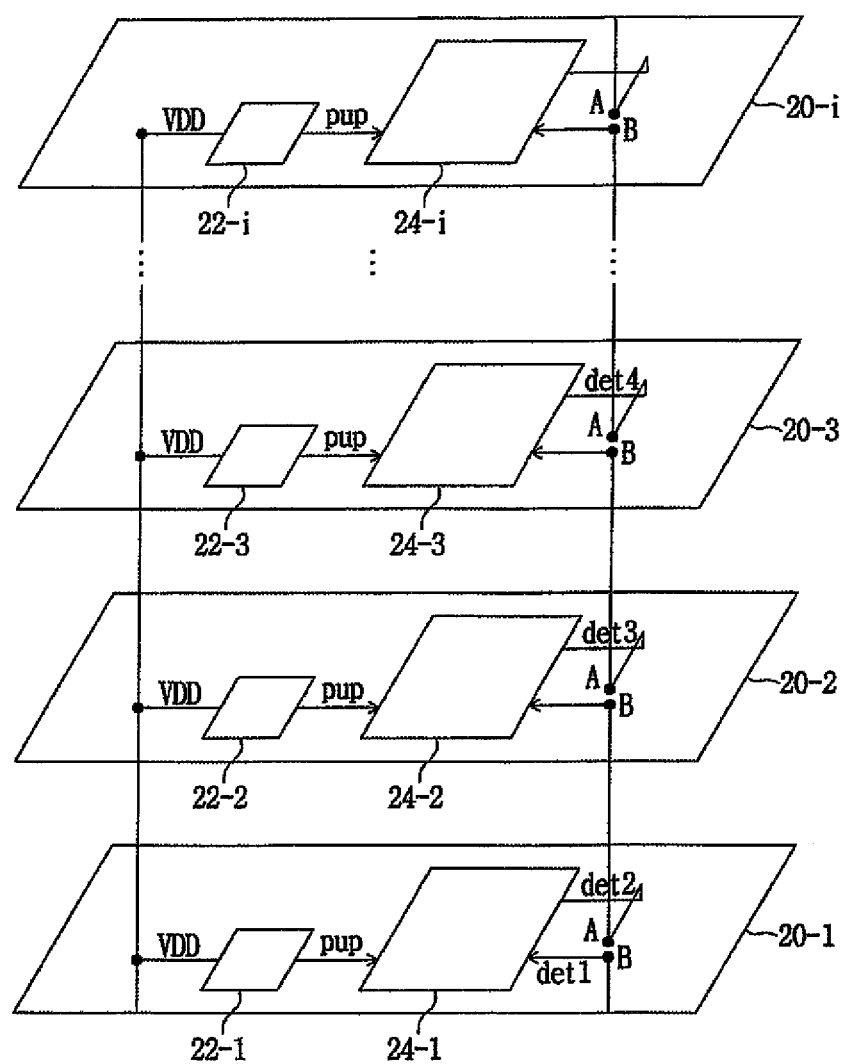
FIG. 1 is a block diagram illustrating a memory device according to an embodiment of the present invention.

FIG. 1 is a block diagram illustrating a memory device containing a chip stack according to an embodiment of the present invention.

As shown in FIG. 1, the memory device of this example includes a plurality (i) of stacked semiconductor memory chips 20-1, 20-2, 20-3, ..., 20-i. The variable "i" is an integer of at least two, i.e., the memory device of this embodiment includes at least two memory chips. The memory chips 20-1~20-i may be stacked using through-silicon via (TSV) techniques. However, the embodiment is not limited to TSV.

Each of the memory chips 20-1~20-i includes a power-up pulse generator and a chip ID generator. In particular, in the example of FIG. 1, the memory chip 20-1 includes a power-up pulse generator 22-1 and a chip ID generator 24-1, the memory chip 20-2 includes a power-up pulse generator 22-2 and a chip ID generator 24-2, the memory chip 20-3 includes a power-up pulse generator 22-3 and a chip ID generator 24-3, and the memory chip 20-i includes a power-up pulse generator 22-i and a chip ID generator 24-i.

Each of the power-up pulse generators 22-1~22-i is responsive to activation of a power supply to generate a power-up pulse (pup) signal. For example, the power supply may be an external power VDD, and the power-up pulse generators 22-1~22-i may generate the power-up pup signal by directly detecting activation of the external power VDD, or by detecting the transition of an internal voltage beyond a threshold voltage.

The chip ID generators 24-1~24-i are operatively connected in a cascade arrangement such an output A of each generator is supplied as the input B of each next generator. In particular, referring to the example of FIG. 1, a detection signal det1 is supplied as an input to the chip ID generator 24-1, an output detection signal det2 from the chip ID generator 24-1 is supplied an input to the chip ID generator 24-2, an output detection signal det3 from the chip ID generator 24-2 is supplied as an input to the chip ID generator 24-3, and an output detection signal det4 from the chip ID generator 24-3 is supplied as an input to the chip ID generator 24-4 (in the case where i=4)

Figure 2:
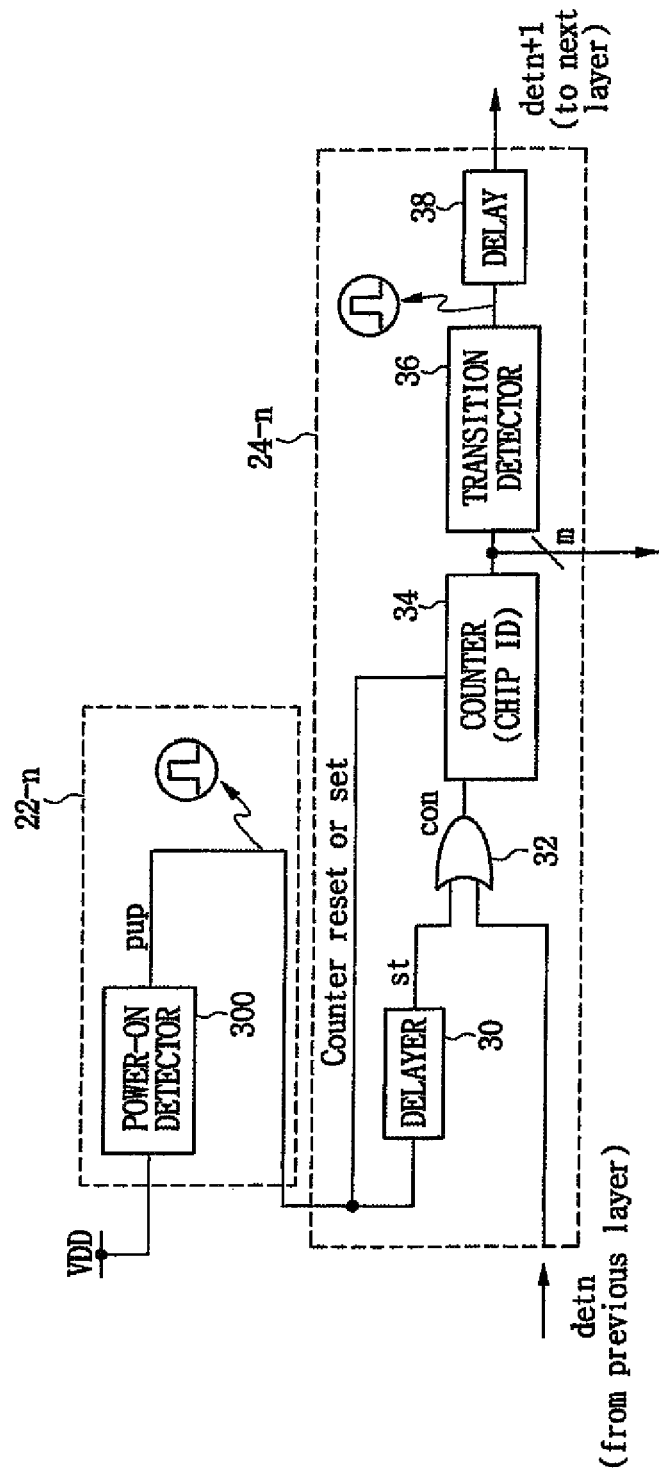
FIG. 2 is a block diagram of a power-up pulse generator and a chip ID generator illustrated in FIG. 2 according to an embodiment of the present invention.

Attention is now directed to FIG. 2, which is a block diagram illustrating examples of the power-up pulse generator 22-n and chip ID generator 24-n shown in FIG. 1, where "n" is 1 to "i".

In this example, the power-up pulse generator 22-n is connected to receive the external power supply voltage VDD, and includes a power-on detector 300 containing circuitry which generates a power-on pulse signal pup of a given pulse width upon activation of the external power supply voltage VDD. The internal circuitry of the power-on detector 300 is not limited, and it is well within the ordinary skill in the art to design and implement a variety of circuit configurations capable of generating a signal of a given pulse width in response to activation of VDD. Also, at mentioned previously, the power-up pulse generator 22-n may instead detect an increase in an internal voltage (e.g., by comparison with a threshold) which is dependent upon activation of the external supply voltage. In other words, activation of the external supply voltage VDD need not be directly detected.

Still referring to FIG. 2, the chip ID generator 24-n of this example includes a first delay circuit 30, an OR circuit 32, a counter 34, a transition detector 36, and a second delay circuit 38.

The first delay circuit 30 delays the power-up pulse signal pup to generate a start pulse st which is delayed in time relative to the power-up pulse signal pup. The internal circuitry of the first delay circuit 30 is not limited, and it is well within the ordinary skill in the art to design and implement a variety of circuit configurations capable of generating a start pulse st which is delayed in time relative to the power-up pulse signal pup. The first delay circuit 30 may, for example, includes passive and/or active elements.

The OR circuit 32 generates a counter signal con which is the logic OR of the start pulse signal st and an input detection signal detn.

As will be explained in more detail later, the input detection signal detn is received from the chip ID generator of a previous layer, i.e., a previous chip among the stacked chips constituting the memory device. In the case where the chip ID generator 24-n is contained in the first layer, i.e, the first memory chip, the input detection signal detn is maintained at a given logic level.

The counter circuit 34 is reset (or set) in response to the power-on pulse pup. Alternately, for example, the counter circuit 34 may be set or reset in response to an externally input synchronization signal. In addition, the counter circuit 34 executes a logical counting operation in response to each pulse of the counter signal con. In particular, the counter circuit 34 generates an m-bit output signal that is incremented in response to each pulse contained in the counter signal con. The internal circuitry of the counter circuit 34 is not limited, and it is well within the ordinary skill in the art to design and implement a variety of circuit configurations capable of generating an output value that is incremented in response to pulse of the counter signal con. An example of the counter circuit 34 will be described later with reference to FIG. 4.

The transition detector 36 is configured to generate a pulse upon detection of a state transition in the m-bit output of the counter circuit 34, and the second delay circuit 38 is configured to delay the pulse generated by the transition detector 36 to output a pulse signal detn+1 which is applied to a next layer (chip) of the memory device. The internal circuitry of the transition detector 36 and second delay circuit 38 is not limited, and it is well within the ordinary skill in the art to design and implement a variety of circuit configurations capable of an output pulse which is delayed relative to the transition of the output count of the counter circuit 34. In this regard, it is noted that the transition detector 36 and second delay circuit 38 may be particularly combinable into a single circuit block.

Figure 3:
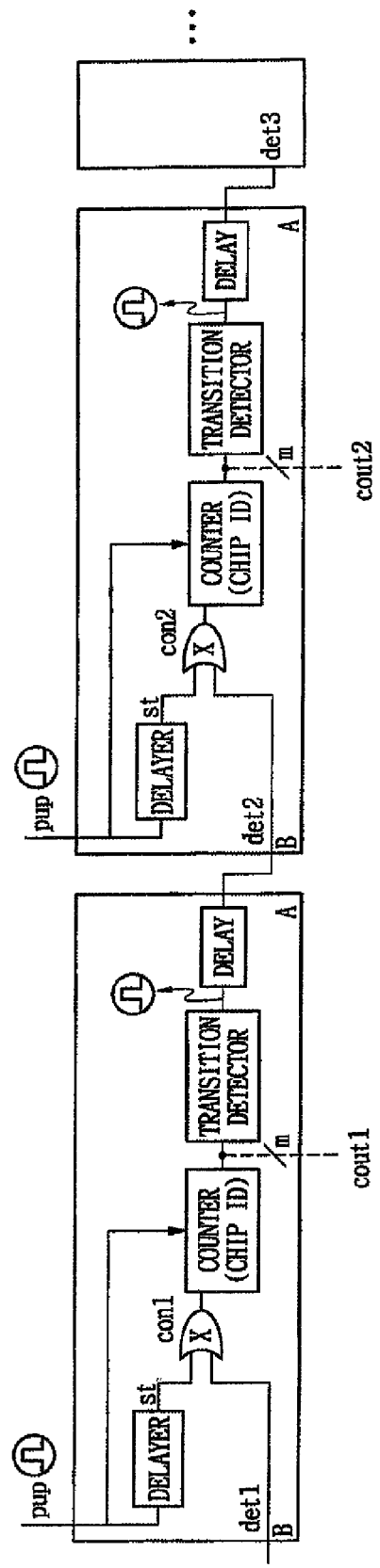
FIG. 3 is a block diagram illustrating the connection of chip ID generators illustrated in FIG. 2 according to an embodiment of the present invention.

FIG. 3 illustrates an example of the cascade connection of the chip ID generators of the first three memory chips 20-1~20-3, namely, the chip ID generators 24-1, 24-2 and 24-3 of FIG. 1. As shown, the output of the first chip ID generator 24-1 constitutes input detection signal det2 of the second chip ID generator 24-2, the output of the second chip ID generator 24-2 constitutes input detection signal det3 of the third chip ID generator 24-3, and so on.

It is noted that the input terminal for receiving the detection signal det1 and the OR circuit 32 of the first chip ID generator 24-1 may be omitted, and that the transition detector 36 and second delay circuit 38 of the last chip ID generator 24-i may be omitted. However, in an embodiment of the invention, the memory chips 20-1~20-*i* are all formed from the same fabrication masks and have the same configuration, and thus, any of the memory chips can advantageously be located anywhere in the stack of memory chips. In this case, the first chip ID generator 24-1 includes an input terminal for receiving the detection signal det1 and the OR circuit 32, and the last chip ID generator 24-*i* includes the transition detector 36 and second delay circuit 38.

Figure 4:
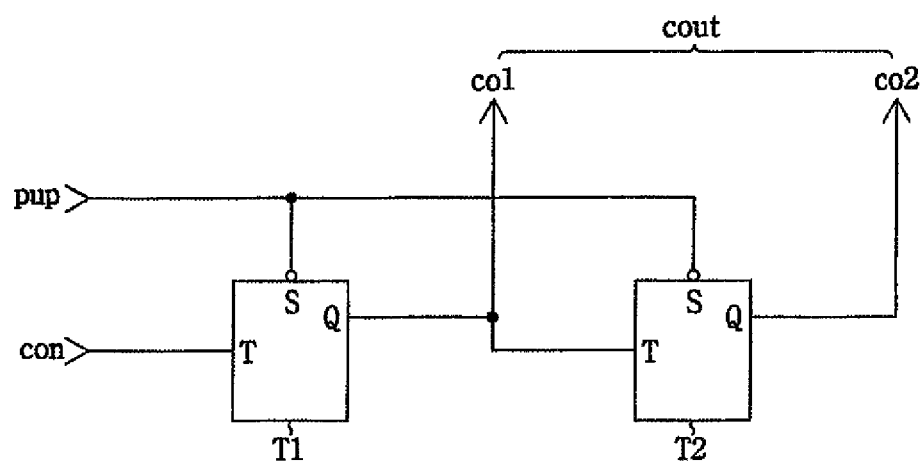
FIG. 4 is a circuit diagram illustrating a counter contained in a chip ID generator according to an embodiment of the present invention.

FIG. 4 illustrates an example of the counter circuit 34. In this example, the output of the counter circuit 34 is a 2-bit (m=2) signal, having bits co1 and co2. As shown, the counter circuit 34 includes a first toggle switch T1 which receives the counter signal con and which outputs the bit co1, and a second toggle switch T2 which receives the output from the first toggle switch T1 and outputs the second bit co2. Both of the toggle switches T1 and T2 include a set terminal connected to receive the power-up signal pup.

An operation of the memory device illustrated in the example of FIGS. 2~4 will now be described with reference to the transition table of FIG. 5. In FIG. 5, time periods t0~t4 denote processing time periods, such as synchronous clock periods, after power-on of the memory device.

In the description that follows, it is assumed that i=4, i.e., that the memory device contains four stacked memory chips 20-1~20-4

Referring collectively to FIGS. 2~5, upon power-on of the memory device, the power-on pulse pup signal generated by the power-on detector 22-*n* of each memory chip 20-*n* transitions to logic H (high) during time period t0. The power-on pulse pup signal then returns to logic L (low) during the remaining time periods t1~t4.

The logic H power-on pulse pup signal is applied to each of the set terminals of each of counter circuits 34 of the chip ID generators 24-*n*, thus setting an output cout thereof to logic "11" in the time period t0.

Also during the initial time period t0, each of the detection signals det1, det2, det3 and det4 is held at logic L, and the output con1, con2, con3 and con4 of each of the OR circuits 32*n* is logic L.

The power-on pulse signal pup is delayed by the first delay circuit 30 of each of the chip ID generators 24-*n*, and as a result, the start signal st is transitioned from logic L to logic H in the time period t1 in each of the chip ID generators 24-*n*. Thereafter, in time periods t2~t4, the start signal st returns to logic L.

The logic H level of the start signal st in time period t1 causes the outputs con1, con2, con3 and con4 of the OR circuit2 32 to transition from logic L to H, which in turn causes the counter circuits 34 to increment the output s cout1, cout2, cout3 and cout4 thereof from "11" to "00" in the time period t1. The detection signals det1, det2, det3 and det4 all remain at logic level L during the time period t1.

It is noted here that the m-bit output cout1 of logic value "00" from the first chip ID generator circuit 24-1 constitutes the chip ID of the first memory chip 20-1.

In time period t2, the detection signal det1 remains a logic L and the start signal st returns to logic L, and thus the counter signal con1 of the first chip ID generator 24-1 returns to logic L. Further, in time period t2, the transition detector 36 and second delay circuit 38 of the chip ID generators 24-1~24-4 generate a pulse having a logic level H in response to the transition of the outputs cont1~cont4 from logic "11" to "00" (in period t1). As such, each of the detections signals det2, det3 and det4 is logic H during time period t2, and the counter signals con2, con3 and con4 output from the corresponding OR circuits 32 become logic H in the second through fourth chip ID generators 24-2, 24-3 and 24-4. As a result, the counter circuits 34 of the second through fourth chip ID generators 24-2, 24-3 and 24-4 are each incremented such that outputs (cont2, cont3 and cont4) thereof become "01".

It is noted here that the m-bit output cout2 of logic value "01" from the chip ID generator circuit 24-2 constitutes the chip ID of the second memory chip 20-2.

In time period t3, the second detection signal det2 returns to logic L, and thus counter signal con2 of the second chip ID generator 24-2 returns to logic L. Further, in time period t3, the transition detector 36 and second delay circuit 38 of the chip ID generators 24-2~24-4 generate a pulse having a logic level H in response to the transition of the output cont2, cont3 and cont4 from logic "00" to "01" (in period t2). As such, the detections signals det3 and det4 are logic H during time period t3, and the counter signals con3 and con4 output by the OR circuits 32 are logic H in the third and fourth chip ID generators 24-3 and 24-4. As a result, the counter circuits 34 of the third and fourth chip ID generators 24-3 and 24-4 are each incremented such that outputs (cont3 and cont4) thereof become "10".

It is noted here that the m-bit output cout3 of logic value "10" from the chip ID generator circuit 24-3 constitutes the chip ID of the third memory chip 20-3.

In time period t4, the third detection signal det3 returns to logic L, and thus counter signal con3 of the third chip ID generator 24-3 returns to logic L. Further, in time period t4, the transition detector 36 and second delay circuit 38 of the chip ID generators 24-3~24-4 generate a pulse having a logic level H in response to the transition of the output cont3 and cont4 from logic "01" to "10" (in period t3). As such, the detection signals det4 is logic H during time period t4, and the counter signal con4 output by the OR circuit 32 is logic H in the fourth chip ID generator 24-4. As a result, the counter circuit 34 of the fourth chip ID generator 24-4 is incremented such that output (cont4) thereof becomes "11".

It is noted here that the m-bit output cout4 of logic value "11" from the chip ID generator circuit 24-4 constitutes the chip ID of the fourth memory chip 20-4.

Figure 6:
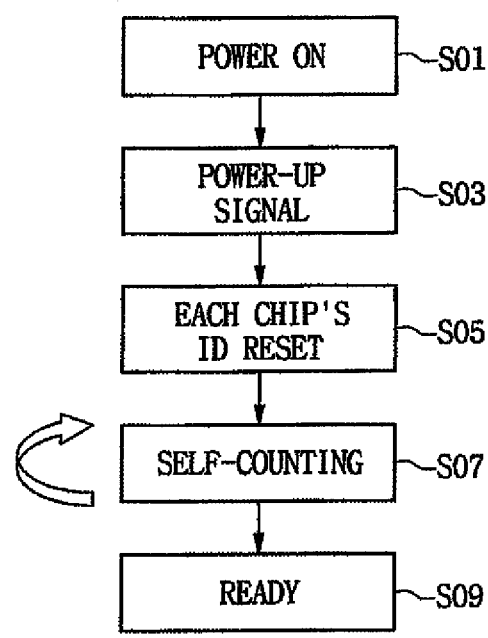
FIG. 6 is a flow chart for use in the describing the initialization of a memory device according to an embodiment of the present invention.

FIG. 6 is a flow chart summarizing the process described above. Referring to FIG. 6, a power-on condition occurs at S01, results in the generation of a power-up signal at S03. The chip ID of each memory chip is reset in response to the power-up signal at S05, and then a cascade driven self-counting process is executed at S07 to obtain the chip ID of each memory chip. The memory device is then ready of operations at S09.

As described above, the chip ID of each of the stacked memory chips is automatically generated within each chip in response to a power-on condition, and without the need for an externally supplied command signal. Further, in the case of utilizing through-silicon-via TSV fabrication, for example, each of the memory chips can be fabricated using the same masks, and the number of vias required can be minimized.

In the example provided above, the memory device includes a stack of four (4) memory chips. However, the embodiment is not limited by the number of memory chips. Also, the number of bits m of the counter output cont is dependent upon the number memory chips in the memory device. Two memory chips would require a 1-bit counter output, three or four memory chips would require a 2-bit counter output, five to eight memory chips would require a 3-bit counter output, and so on.

Figure 7:
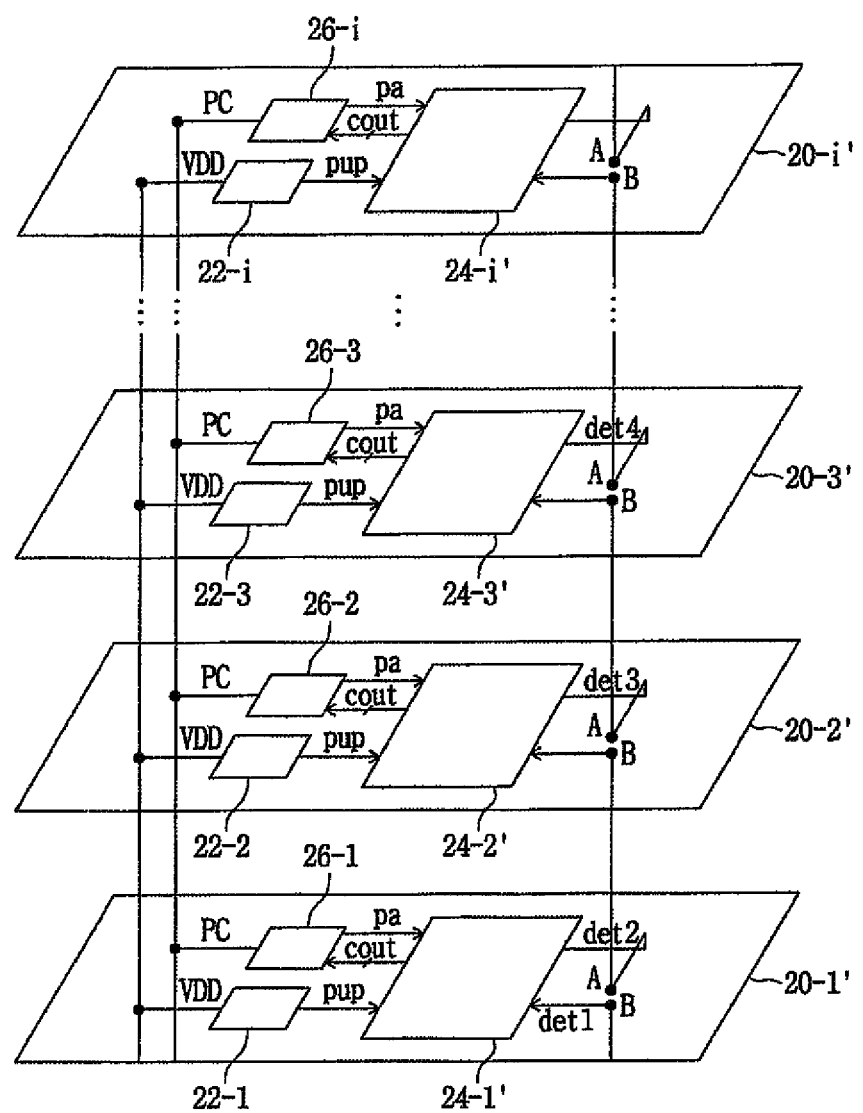
FIG. 7 is a block diagram illustrating a memory device according to another embodiment of the present invention.

FIG. 7 is a block diagram illustrating a memory device according to another embodiment of the present invention. This embodiment is at least partially characterized by selectively disabling the chip ID generation process of the previous embodiment in the case where chip IDs are already stored in a non-volatile manner, for example, using fuse elements. Thus, for example, it is possible to execute the automatic generation of chip IDs as described in connection with the first embodiment, and then to set the chip ID using fuse elements. Then, upon a next power-on of the memory device, the chip IDs are retrieved using the set fuse elements.

Referring to FIG. 7, the memory device of this example includes a plurality (i) of stacked semiconductor memory chips 20-1', 20-2', 20-3', . . . , 20-i'. The variable "i" is an integer of at least two, i.e., the memory device of this embodiment includes at least two memory chips. The memory chips 20-1'~20i' may be stacked using through-silicon via TSV techniques. However, the embodiment is not limited to TSV.

Each of the memory chips 20-1'~20-i' includes a power-up pulse generator, a chip ID generator and a program block. In particular, in the example of FIG. 7, the memory chip 20-1 includes a power-up pulse generator 22-1, program block 26-1 and a chip ID generator 24-1', the memory chip 20-2 includes a power-up pulse generator 22-2, program block 26-2 and a chip ID generator 24-2', the memory chip 20-3 includes a power-up pulse generator 22-3, program block 26-3 and a chip ID generator 24-3', and the memory chip 20-i includes a power-up pulse generator 22-i, program block 26-i and a chip ID generator 24-i'.

Like the previous embodiment, each of the power-up pulse generators 22-1~22-i is responsive to activation of a power supply to generate a power-up pulse (pup) signal. For example, the power supply may be an external power VDD, and the power-up pulse generators 22-1~22-i may generate the power-up pulse pup signal by directly detecting activation of the external power VDD, or by detecting the transition of an internal voltage beyond a threshold voltage.

The program blocks 26-1~26-i contain circuits (e.g., fuse circuits) for storing a chip ID of the respective memory chips 20-1'~20-i', and are responsive to a common power control signal PC to selectively disable the automatic generation of chip IDs described in connection with the previous embodiment of the invention. The program blocks 26-1~26-i will be described in more detail later herein.

The chip ID generators 24-1'~24-i' are operatively connected in a cascade arrangement such that an output A of each generator is supplied as the input B of each next generator. In particular, referring to the example of FIG. 7, a detection signal det1 is supplied as an input to the chip ID generator 24-1', an output detection signal det2 from the chip ID generator 24-1' is supplied as an input to the chip ID generator 24-2', an output detection signal det3 from the chip ID generator 24-2' is supplied as an input to the chip ID generator 24-3', and an output detection signal det4 from the chip ID generator 24-3' is supplied as an input to the chip ID generator 24-4' (in the case where i=4).

Figure 8:
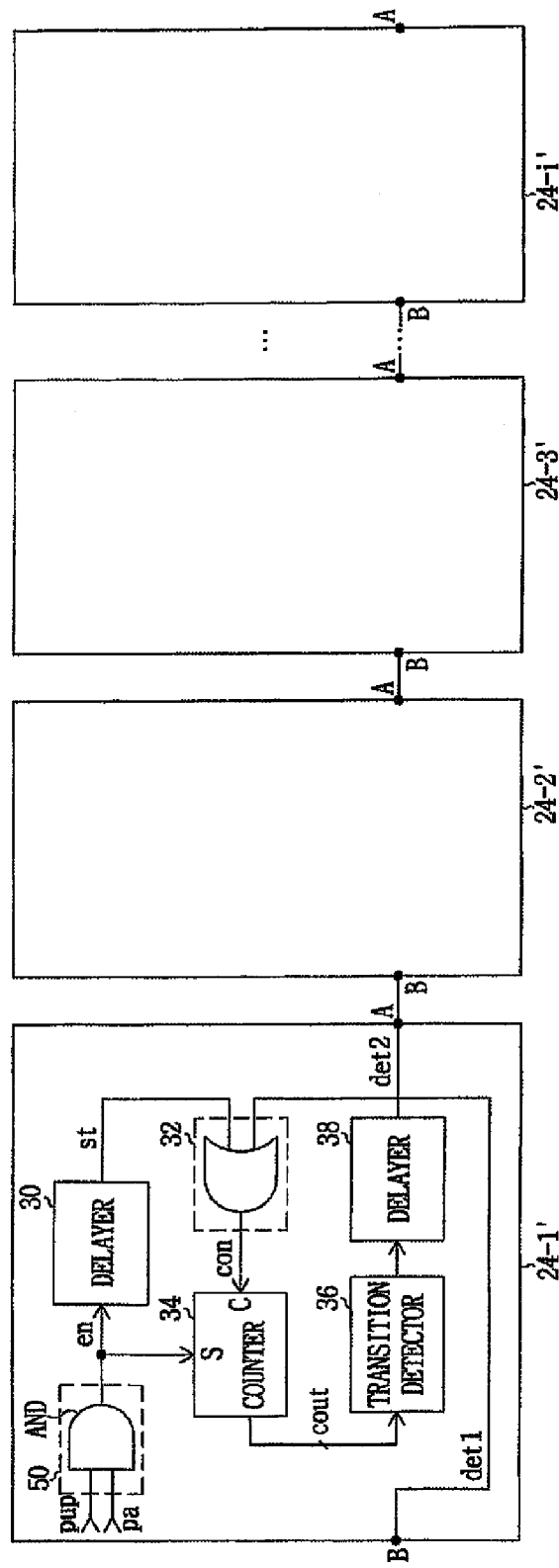
FIG. 8 is a block diagram illustrating a chip ID generator according of the memory device of FIG. 9 according to an embodiment of the present invention.

FIG. 8 depicts the cascade connection of the chip ID generators 24-1'~24-i', as well as a block diagram of the internal configuration of the first chip ID generator 24-1'. It can be seen that the chip ID generators 24-1'~24-i' of the present embodiment are closely similar to that of the previous embodiment (like elements are denoted by like reference numbers), except for the addition of an enable circuit 50 connected to the input of the first delay circuit 30 and to the set terminal of the counter circuit 34. In this example, the enable circuit 50 is constituted by an AND gate which receives the power-up pulse pup signal and a power confirmation signal pa. It will be readily apparent that when the power confirmation signal pa is logic H, the chip ID generators 24-1'~24-i' operate in the same manner as described in the previous embodiment. On the other hand, when the power confirmation signal pa is logic L, the chip ID generators 24-1'~24-i' are operationally disabled.

Figure 9:
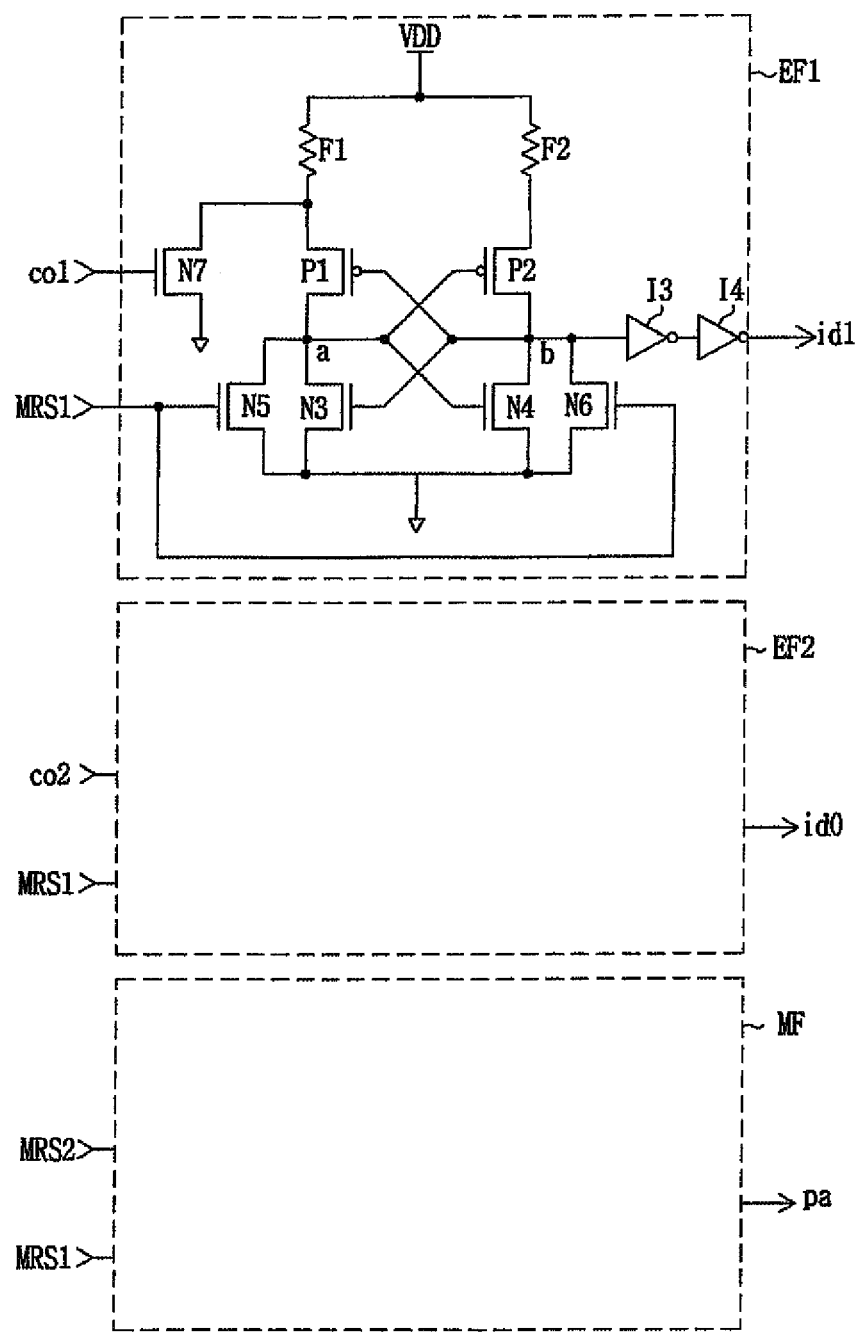
FIG. 9 is a circuit diagram illustrating a fuse ID circuit of the memory device of FIG. 9 according to an embodiment of the present invention.

FIG. 9 illustrates an example of a program block 26-1~26-i illustrated in FIG. 7. In FIG. 9, EF1 and EF2 denote chip ID fuse circuits, and MF denotes a master fuse circuit. Each of the fuse circuits may be similarly configured, and in FIG. 9, reference characters F1 and F2 denote fuses, reference characters P1 and P2 denote PMOS transistors, reference characters N3~N7 denote NMOS transistors, and reference characters I3 and I4 denote inverter circuits. Further, co1 and co2 are the bits of the counter circuit output cout (see FIG. 4), which are utilized when the program block is written with the chip ID generated in the sequence described in the previous embodiment, and id0 and id1 are the output bits of the written chip ID when the written chip ID is read. MRS1 is a program enable signal which is utilized to generate and set the chip IDs, and MRS2 is a program disable signal which is utilized when the chip IDs are already set. The MRS1 and MRS2 signals may be applied via the power control signal PC shown in FIG. 7.

For example, upon a first power-on of the memory device, the MRS1 signal is active, the program confirmation signal pa may be set to logic H, and the automatic chip ID generation sequence described in connection with the previous embodiment is executed. The resultant chip IDs (cont) are applied to the program blocks to set the fuse elements therein. Then, upon a next power-on of the memory device, the MRS2 signal is active, and the program confirmation signal pa may be set to logic L, thus disabling the automatic generation of chip IDs. Instead, the already set fuse data is utilized to determine chip IDs.

Figure 10:
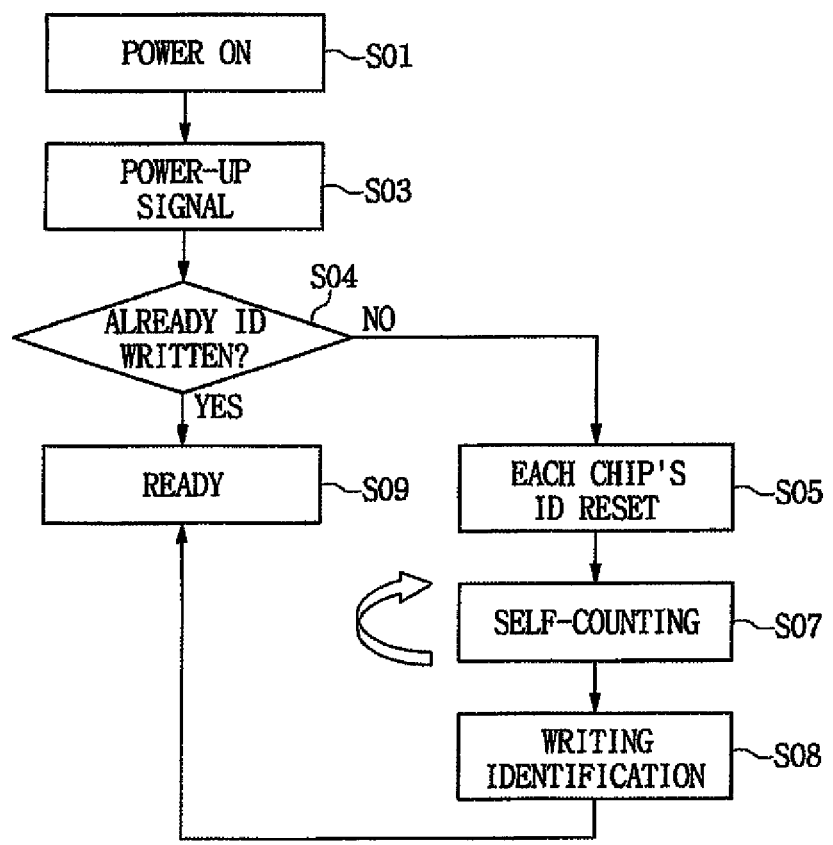
FIG. 10 is a flow chart for use in the describing the initialization of a memory device according to another embodiment of the present invention.

FIG. 10 is a flow chart summarizing the process described above. Referring to FIG. 10, a power-on condition occurs at S01, results in the generation of a power-up signal at S03. Then, a determination is made as to whether the chip IDs have already been written into a program block (e.g., fuse block) as S04. If the chip IDs have already been written, then the process is complete and the memory device is operationally ready at S09. If the chip IDs have not been written, the chip ID of each memory chip is reset in response to the power-up signal at S05, and then a cascade driven self-counting process is executed at S07 to obtain the chip ID of each memory chip. The thus obtained chip IDs are then written in the respective program blocks at S08, and the memory device is then ready for operations at S09.

Figure 11:
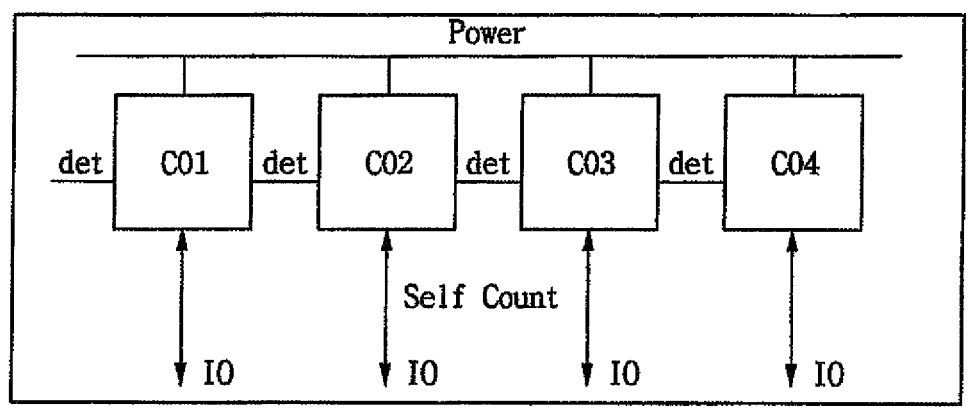
FIG. 11 is a block diagram illustrating a memory device according to another embodiment of the present invention.

The embodiments described above are related to stacked memory devices in which two or more memory chips are stacked one over the other to form a device package. However, the invention is not limited in this respect, and instead can also be applied to planar device packages in which two or more memory chips are arranged in a same plane. An example of this is illustrated in FIG. 11 in which multiple memory chips C01, C02, C03 and C04 are arranged at the surface of a common substrate. A cascade connection of detection lines det is also shown, as well as input output lines IO for generating the chip IDs in the same manner as described in connection with the previous embodiments.

The foregoing is illustrative of the present invention and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device, comprising a plurality of memory chips, each including a chip identification (ID) generation circuit, wherein the chip ID generation circuits of the respective memory chips are operatively connected together in a cascade configuration by corresponding single-line terminal connections coupled between the chip ID generation circuits of adjacent memory chips, and wherein the chip ID generation circuits are activated in response to application of a power supply voltage to the memory device to sequentially generate respective chip ID numbers of the plurality of memory chips, wherein each of remaining chip ID generation circuits excepting a first chip ID generation circuit among the cascade connected chip ID generation circuits receives a pulse signal transmitted over a corresponding single-line terminal connection output from a preceding cascade connected chip ID generation circuit, wherein each of the remaining chip ID generation circuits includes a counter sequentially changing a count value in response to the pulse signal until a chip ID number is generated.

2. The semiconductor device of claim 1, wherein the memory chips are stacked.

3. The semiconductor device of claim 1, wherein the chip ID generation circuits are activated in synchronization with an externally supplied power control signal.

4. The semiconductor memory device of claim 1, wherein the first chip ID generation circuits includes a counter which outputs the chip ID number, and wherein a count number of the counter of the first chip ID generation circuit is pre-set.

5. The semiconductor memory device of claim 1, wherein each of the remaining chip ID generation circuits includes a counter having an output which is incremented in response to the pulse signal output from the preceding chip ID generation circuit, and wherein the output of the counter generates the chip ID number of the respective memory chip.

6. The semiconductor memory device of claim 1, wherein the chip ID number generated by each chip ID generation circuit is initially reset in response to the supply voltage.

7. The semiconductor memory device of claim 1, further comprising a program block for storing the chip ID number generated by a respective counter circuit.

8. The semiconductor memory device of claim 7, wherein the program block includes at least one fuse for storing the chip ID number generated by a respective chip ID generation circuit.

9. The semiconductor memory device of claim 7, wherein the program block is configured to disable the sequential generation of respective chip identification signals when the chip ID numbers are already stored in the program block.

10. The semiconductor memory device of claim 1, wherein the counter outputs m bits as the chip ID number over respective m output terminals, where m is two or more, and wherein the m output terminals are separate from the single-line terminal connections coupled between the chip ID generation circuits.

11. A semiconductor memory device, comprising a memory chip including a chip identification (ID) generation circuit, wherein the chip ID generation circuit is operatively connected with other chip ID generation circuits included in other memory chips of the semiconductor memory device in a cascade configuration by corresponding single-line terminal connections coupled between the chip ID generation circuits of adjacent memory chips, and wherein the chip ID generation circuit is activated in response to application of a power supply voltage to the memory device to generate chip ID number of the memory chip according to a pulse signal transmitted over a corresponding single-line terminal connection from a preceding cascade connected chip ID generation circuit.

12. The semiconductor device of claim 11, wherein the chip ID generation circuit is activated in synchronization with an externally supplied power control signal.

13. The semiconductor memory device of claim 11, wherein the chip ID generation circuit includes a counter having an output which is incremented in response to the pulses of the pulse signal output from the preceding chip ID generation circuit, and wherein the output of the counter generates the chip ID number of the memory chip.

14. The semiconductor memory device of claim 13, wherein a count number of the counter no longer changes when the preceding chip ID generation circuit does not output the pulse signal and the unchanging count number is generated as the chip ID number.

15. The semiconductor memory device of claim 11, wherein the chip ID number generated by the chip ID generation circuit is initially reset in response to the supply voltage.

16. The semiconductor memory device of claim 13, wherein the counter outputs m bits as the chip ID number over respective m output terminals, where m is two or more, and wherein the m output terminals are separate from the single-line terminal connections coupled between the chip ID generation circuits.

* * * * *